(12) United States Patent
Baek

(10) Patent No.: US 7,595,559 B2
(45) Date of Patent: Sep. 29, 2009

(54) INTEGRATED CIRCUIT CHIP HAVING PASS-THROUGH VIAS THEREIN THAT EXTEND BETWEEN MULTIPLE INTEGRATED CIRCUITS ON THE CHIP

(75) Inventor: Seung Duk Baek, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 466 days.

(21) Appl. No.: 11/339,973

(22) Filed: Jan. 26, 2006

(65) Prior Publication Data
US 2006/0118972 A1    Jun. 8, 2006

(51) Int. Cl.
*H01L 23/535* (2006.01)
(52) U.S. Cl. ............ 257/777; 257/288; 257/E23.079; 257/774
(58) Field of Classification Search ........ 257/777, 257/288, 401, 341, E23.079, 774
See application file for complete search history.

(56) References Cited

U.S. PATENT DOCUMENTS

| | | | |
|---|---|---|---|
| 4,499,655 A | 2/1985 | Anthony | |
| 5,677,569 A | 10/1997 | Choi et al. | |
| 5,688,721 A | 11/1997 | Johnson | |
| 5,818,107 A | 10/1998 | Pierson et al. | |
| 6,002,177 A | 12/1999 | Gaynes et al. | |
| 6,069,812 A * | 5/2000 | Lee et al. | 365/51 |
| 6,107,121 A | 8/2000 | Diffenderfer et al. | |
| 6,117,299 A | 9/2000 | Rinne et al. | |
| 6,124,149 A | 9/2000 | Paik et al. | |
| 6,177,721 B1 | 1/2001 | Suh et al. | |
| 6,188,129 B1 | 2/2001 | Paik et al. | |
| 6,344,683 B1 | 2/2002 | Kim | |
| 6,406,937 B1 | 6/2002 | Hedler | |
| 6,429,096 B1 | 8/2002 | Yanagida | |
| 6,528,353 B2 | 3/2003 | Suh et al. | |
| 6,555,902 B2 | 4/2003 | Lo et al. | |
| 6,562,647 B2 | 5/2003 | Zandman et al. | |
| 6,566,232 B1 | 5/2003 | Hara et al. | |
| 6,607,938 B2 | 8/2003 | Kwon et al. | |
| 6,732,913 B2 | 5/2004 | Alvarez | |

(Continued)

FOREIGN PATENT DOCUMENTS

JP    2003-188263    7/2003

(Continued)

OTHER PUBLICATIONS

Sayaka et al., Packaging Technology for Imager May 2004, IEEE, 303-306.*

(Continued)

*Primary Examiner*—Leonardo Andújar
(74) *Attorney, Agent, or Firm*—Myers Bigel Sibley & Sajovec

(57) ABSTRACT

Packaged integrated circuit devices include a package substrate and a multi-chip stack of integrated circuit devices on the package substrate. The multi-chip stack includes at least one chip-select rerouting conductor. This rerouting conductor extends from the package substrate to a chip pad on an upper one of the chips in the multi-chip stack. The chip-select rerouting conductor extends through a first via hole in a lower one of the chips in the multi-chip stack.

9 Claims, 7 Drawing Sheets

U.S. PATENT DOCUMENTS

| | | |
|---|---|---|
| 6,737,295 B2 | 5/2004 | Pendse et al. |
| 6,737,300 B2 | 5/2004 | Ding et al. |
| 6,757,968 B2 | 7/2004 | Lo et al. |
| 6,759,307 B1 | 7/2004 | Yang |
| 6,768,190 B2 | 7/2004 | Yang et al. |
| 6,768,195 B2 | 7/2004 | Drost |
| 6,774,475 B2 | 8/2004 | Blackshear et al. |
| 6,780,746 B2 | 8/2004 | Kinsman et al. |
| 6,781,240 B2 | 8/2004 | Choi |
| 6,787,395 B2 | 9/2004 | Kado et al. |
| 6,791,178 B2 | 9/2004 | Yamaguchi et al. |
| 6,798,061 B2 | 9/2004 | Majid et al. |
| 6,800,169 B2 | 10/2004 | Liu et al. |
| 6,803,252 B2 | 10/2004 | Lao et al. |
| 6,809,416 B1 | 10/2004 | Sharma |
| 2003/0173678 A1 | 9/2003 | Mizukoshi |
| 2004/0043535 A1 | 3/2004 | Jeung et al. |
| 2005/0046002 A1 | 3/2005 | Lee et al. |
| 2006/0043425 A1* | 3/2006 | Sakurai ..................... 257/207 |

FOREIGN PATENT DOCUMENTS

| | | |
|---|---|---|
| JP | 2005-072596 | 3/2005 |
| KR | 2001-001159 | 1/2001 |
| KR | 1020010001159 A | 1/2001 |
| KR | 1020010053901 A | 7/2001 |
| KR | 2003-0023040 | 3/2003 |
| KR | 1020030023040 A | 3/2003 |

OTHER PUBLICATIONS

"UCSP—A Wafer-Level Chip-Scale Package," Dallas Semiconductor, Feb. 18, 2003, http://www.maxim-ic.com/appnotes.cfm/appnote_number/1891, 12 pages.

Quinones et al., "Flip Chip, CSP and WLP Technologies: A Reliability Perspective," IMAPS Nordic, Sep. 2001, 7 pages.

"Chip Scale Packaging (CSP)," NASA Electronic Parks and Packaging Program (NEPP), Feb. 3, 2003, http://nepp.nasa.gove/index_nasa.cfm/775/, 2 pages.

"Xilinix Chip Scale Package Solutions," Xilinix Products and Services, Copyright 1994-2004, http://www.xilinix.com/products/csp.htm, 3 pages.

"Chip Scale Packaging (CSP) Technology," California Micro Devices, Copyright 1994-2004, http://www.calmicro.com/products/csp.html, 3 pages.

U.S. Appl. No. 11/147,677, filed Jun. 8, 2005.

* cited by examiner

US 7,595,559 B2

INTEGRATED CIRCUIT CHIP HAVING PASS-THROUGH VIAS THEREIN THAT EXTEND BETWEEN MULTIPLE INTEGRATED CIRCUITS ON THE CHIP

FIELD OF THE INVENTION

The present invention relates to integrated circuit devices and packaging of integrated circuit devices and, more particularly, to integrated circuit chips and multi-chip packaging of integrated circuit chips.

BACKGROUND OF THE INVENTION

High density packaging technologies have been developed to increase the degree of integration of integrated circuit devices. As illustrated by FIGS. 1-2, chip fabrication technologies have been developed to support packaging of multi-chip stacks within a single package. In particular, FIGS. 1-2 illustrate an integrated circuit wafer 11 that may be diced into a plurality of integrated circuit chips 50. Each chip 50 includes a plurality of chip pads 12 (e.g., I/O pads) on one surface of a chip 50 and rerouting conductors 21, which support rerouting of signals from corresponding chip pads 12 to an opposite surface of the chip 50. These rerouting conductors 21 pass through via holes 15, which may extend adjacent a periphery of each chip 50. The via holes 15 are provided in a spacing region S, which extends in a grid-like pattern between the chips 50. Scribe lines 51 extend in the center of this grid-like pattern S. These scribe lines 51 identify the placement of a cutting tool 29 when the wafer 11 is being diced into separate chips 50. To inhibit the likelihood of damage during a dicing step, the width of the spacing regions S may need to be relatively large. Unfortunately, the use of relatively wide spacing regions S can lead to a decrease in the number of chips within each wafer 11.

SUMMARY OF THE INVENTION

Embodiments of the present invention include an integrated circuit chip. This chip includes a semiconductor substrate and first and second distinct integrated circuit devices thereon. The first integrated circuit device extends adjacent a first side of the semiconductor substrate and has a first plurality of chip pads thereon. The second integrated circuit device extends adjacent a second side of the semiconductor substrate and has a second plurality of chip pads thereon. First and second pluralities of via holes are provided. These via holes extend through a portion of the semiconductor substrate located between the first and second integrated circuit devices. First and second pluralities of rerouting conductors are provided. The first plurality of rerouting conductors extend from corresponding ones of the first plurality of chip pads to corresponding ones of the first plurality of via holes. The second plurality of rerouting conductors extend from corresponding ones of the second plurality of chip pads to corresponding ones of the second plurality of via holes. In some of these embodiments, a first one of the first plurality of chip pads is a chip select pad and a first one of the second plurality of chip pads is a chip select pad. In addition, one of the first plurality of rerouting conductors is electrically connected to the first one of the first plurality of chip pads and the first one of the second plurality of chip pads.

Still further embodiments of the invention include a packaged integrated circuit device. This packaged integrated circuit device includes a first semiconductor chip having first and second integrated circuit devices therein and a first plurality of via holes extending through the first semiconductor chip. A second semiconductor chip is mounted on the first semiconductor chip. The second semiconductor chip has third and fourth integrated circuit devices therein and a second plurality of via holes extending through said second semiconductor chip. A first rerouting conductor is provided that extends through the first semiconductor chip. This first rerouting conductor is electrically connected to a chip select pad associated with the first integrated circuit device. A second rerouting conductor is provided that extends through said first semiconductor chip. The second rerouting conductor is electrically connected to a chip select pad associated with the second integrated circuit device.

DETAILED DESCRIPTION OF PREFERRED EMBODIMENTS

Figure 1:
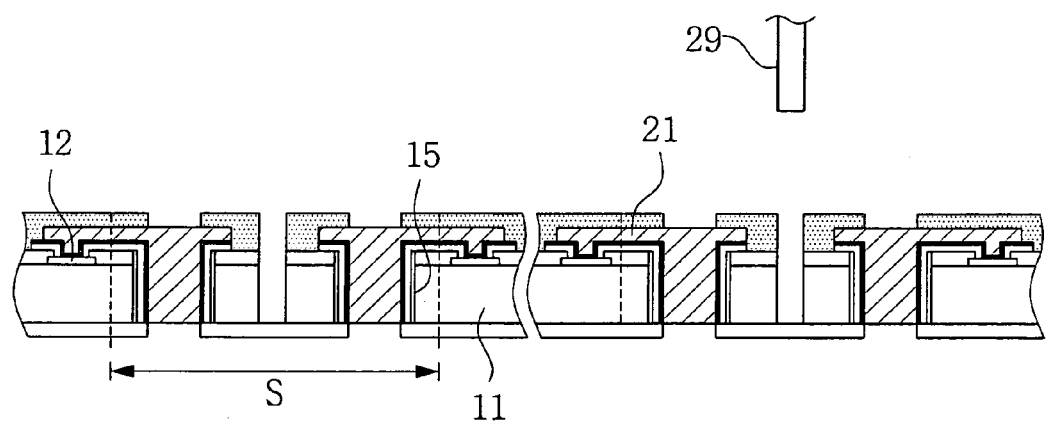
FIG. 1 is a cross-sectional view of an integrated circuit wafer according to the prior art.
Figure 2:
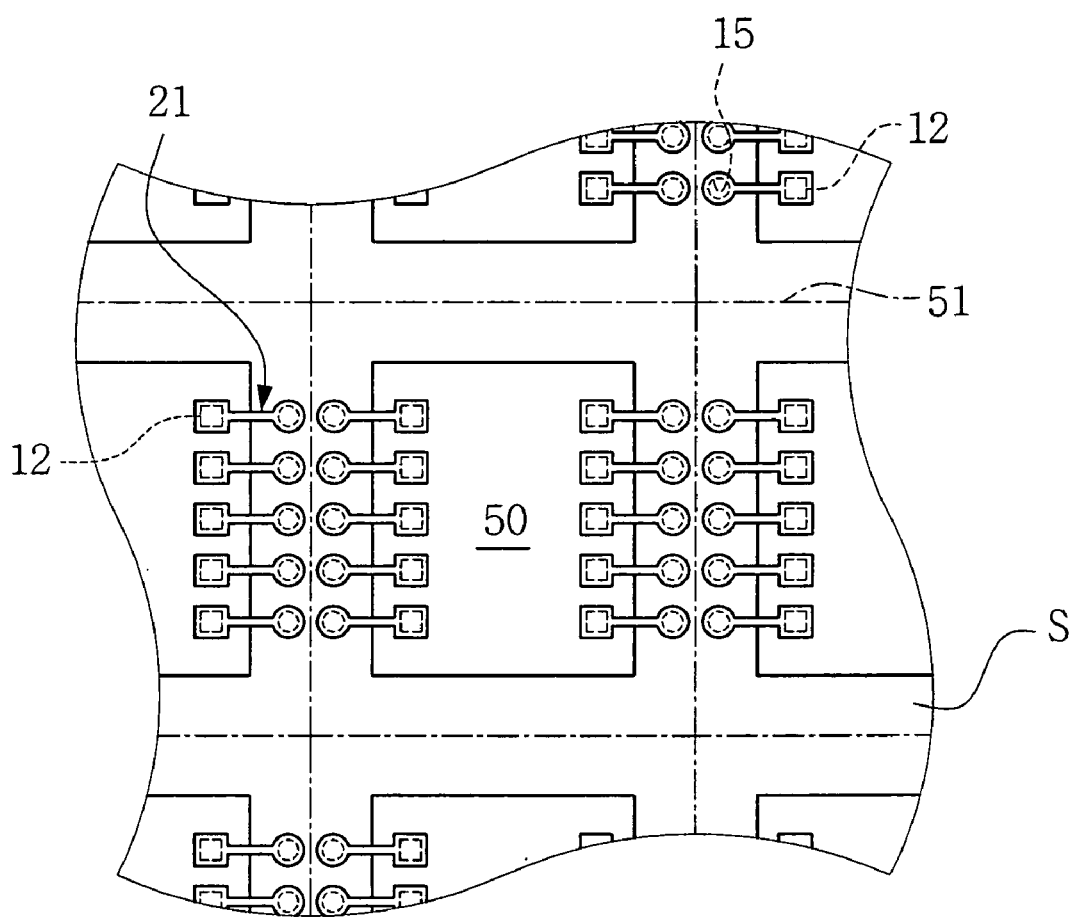
FIG. 2 is a plan view of an integrated circuit wafer according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals refer to like elements throughout.

Figure 3:
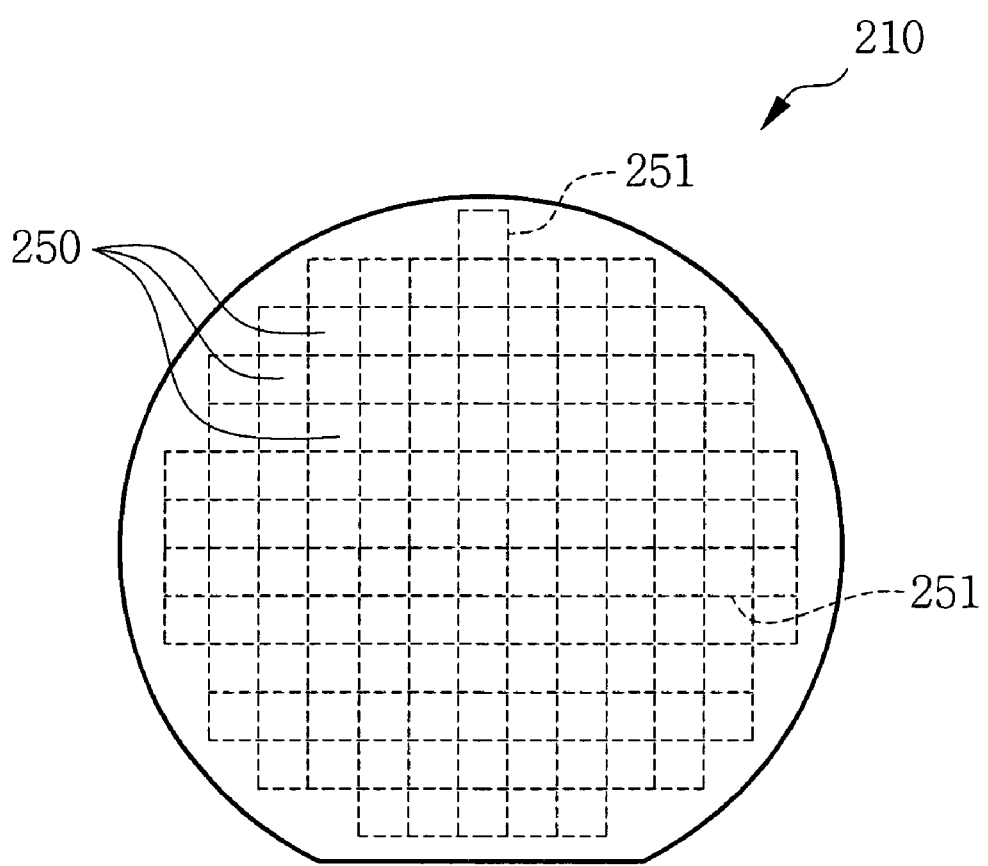
FIG. 3 is a plan view of an integrated circuit wafer having multiple integrated circuit chips therein, according to embodiments of the present invention.
Figure 4:
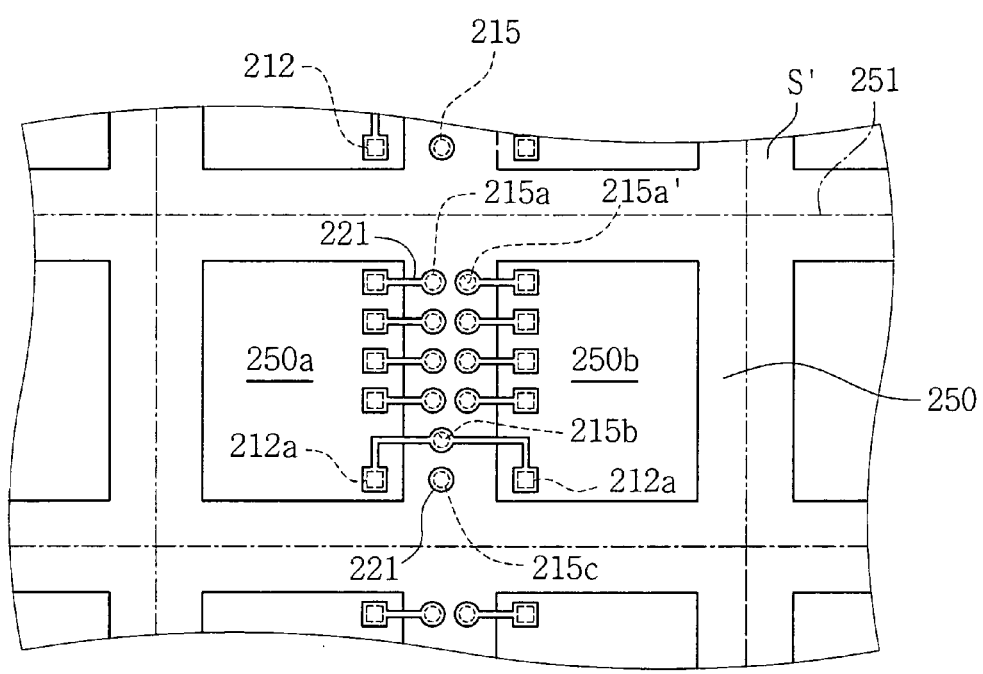
FIG. 4 is a plan view of a portion of an integrated circuit wafer having multi-circuit chips therein, according to embodiments of the present invention.

As illustrated by FIGS. 3-4, an integrated circuit wafer 210 according to embodiments of the present invention includes a plurality of integrated circuit chips 250 arranged in an array pattern. This array pattern is highlighted by a plurality of scribe lines 251, which may identify the center lines of an array of dicing streets having widths equal to the spacing S'. Each of these integrated circuit chips 250 includes at least a pair of separate integrated circuit devices. This pair of integrated circuit devices is illustrated as a left side integrated circuit device 250a and a right side integrated circuit device 250b. These devices 250a and 250b may be configured to perform equivalent or different integrated circuit functions. For example, both devices 250a and 250b may be 256 Mbit DRAM devices or one device 250a may be a DRAM device and the other device 250b may be a 1 Gbit flash memory device. Each of the devices 250a and 250b includes a plurality of chip pads 212, which receive signals from external the chip 250 or transmit signals off the chip 250. These chip pads 212 are electrically connected to circuit elements (not shown) within the devices 250a and 250b. Some of the chip pads 212 may represent input/output (I/O) pads.

Figure 5:
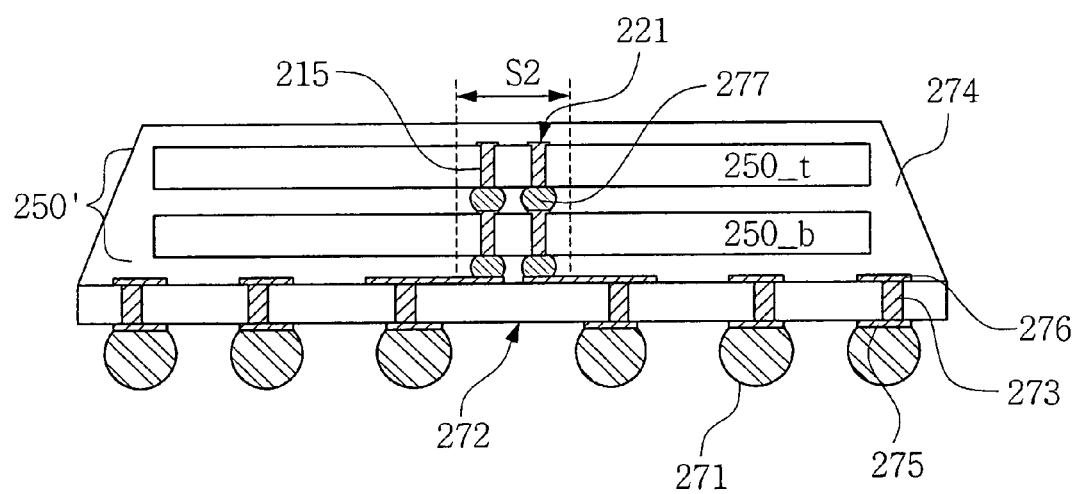
FIG. 5 is a cross-sectional view of a packaged multi-chip stack, according to embodiments of the present invention.
Figure 7:
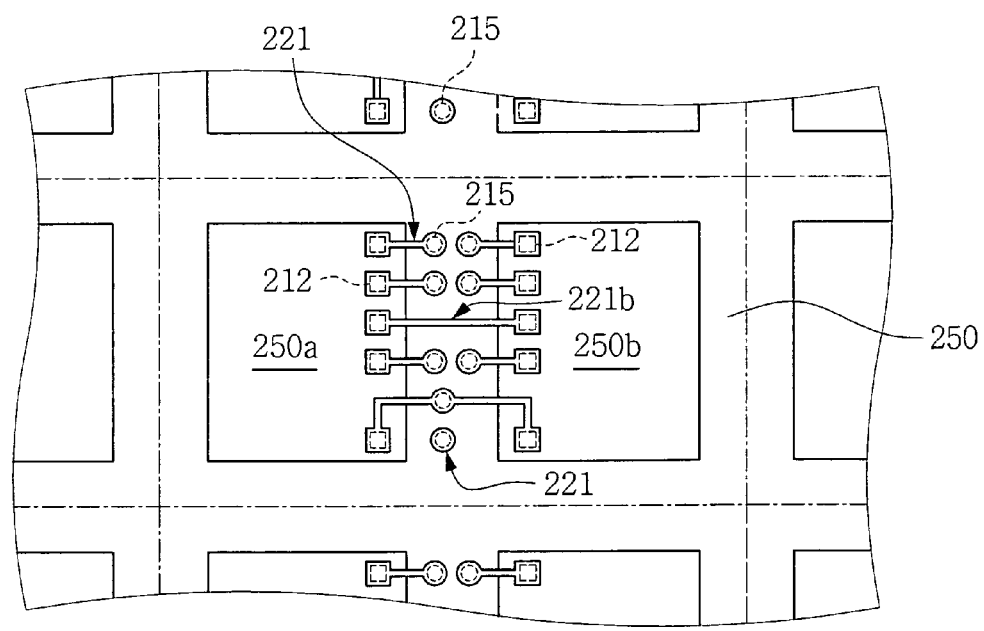
FIG. 7 is a plan view of a portion of an integrated circuit wafer having multi-circuit chips therein, according to embodiments of the present invention.

A plurality of via holes 215 are also provided. These via holes 215, which are illustrated in FIG. 5 as extending vertically through the chip 250, are located in a space between the first and second devices 250a and 250b. The width of this space may be equivalent to the spacing S'. Each of the via holes 215 may be filled with a rerouting conductor 221. As illustrated by FIG. 4, many of these rerouting conductors may be electrically connected a corresponding chip pad 212. In FIG. 7, some of the chip pads 212 on separate devices may be electrically connected together by a respective rerouting conductor 221b that supports interchip communication.

As further illustrated by FIG. 4, the reference characters 215a and 215a' represent left and right via holes within a pair of via holes. The reference character 215b represents a chip select via hole that is electrically connected by a single rerouting conductor 221 to left and right chip select pads 212a associated with the first and second devices 250a and 250b, respectively. The reference character 215c represents a filled via hole, which may operate as a pass-through via to another chip within a stack, as illustrated by FIG. 5. Techniques for forming via holes and rerouting conductors are described more fully in commonly assigned U.S. application Ser. No. 10/890,995, filed Jul. 15, 2004, published as Patent Application No. 2005/0046002, the disclosure of which is hereby incorporated herein by reference.

Figure 6:
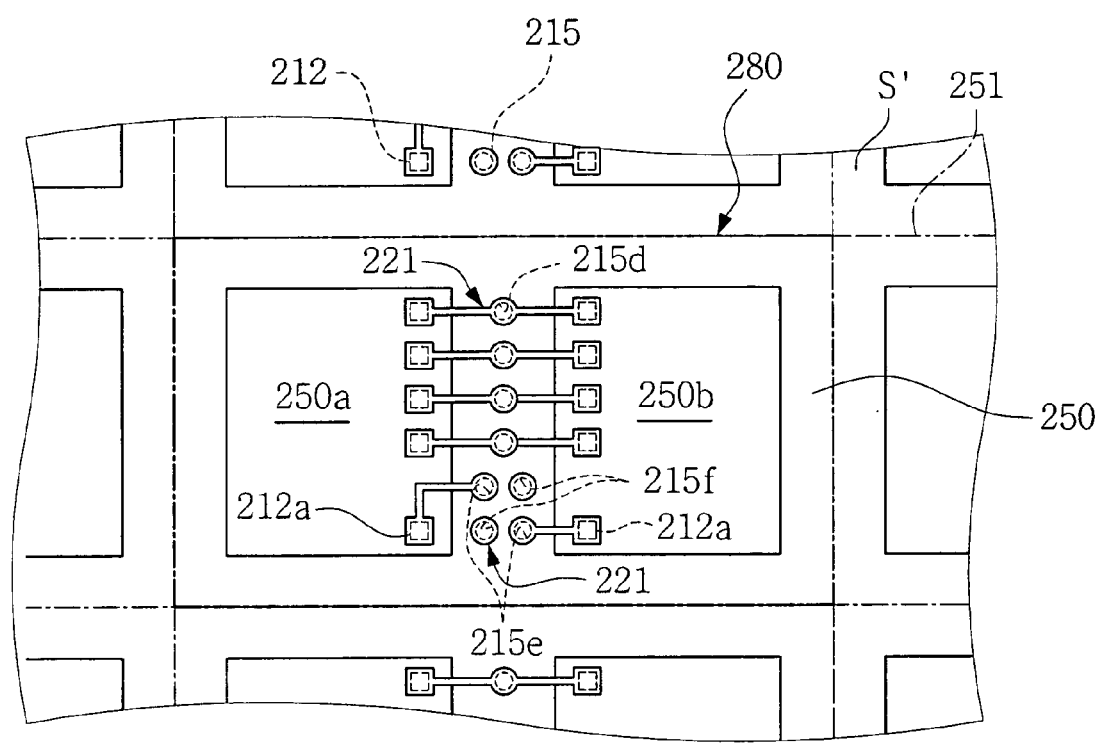
FIG. 6 is a plan view of a portion of an integrated circuit wafer having multi-circuit chips therein, according to embodiments of the present invention.

FIG. 5 illustrates a packaged multi-chip integrated circuit device including a package enclosure 274, a package substrate 272 and lower and upper integrated circuit chips 250_b and 250_t within a multi-chip stack 250'. The package substrate 272 is illustrated as including filled PCB vias 273. These filled vias transfer signals from upper conductive patterns 276 to lower conductive patterns 275 and vice versa. As illustrated, solder balls 271 may be mounted on the lower conductive patterns 275. The illustrated via holes 215 are filled with rerouting conductors 221. These rerouting conductors 221, which extend through the lower and upper integrated circuit chips 250_b and 250_t, include interchip connection bumps 277 (e.g., solder bumps). The illustrated pair of rerouting conductors 221 may pass separate chip select signals to a pair of integrated circuit devices in the upper integrated circuit chip 250_t. Additional rerouting conductors (not shown in FIG. 5) may also be used to pass separate chip select signals to a pair of integrated circuit devices in the lower integrated circuit chip 250_b. The use of four separate rerouting conductors to provide four separate chip select signals to four integrated circuit devices within two chips (e.g., 250_b and 250_t) can be achieved using the via hole formation illustrated by FIG. 6. In FIG. 6, the via holes 215e may be used to provide separate chip select signals to the chip pads 212a associated with the first and second integrated circuit devices 250a and 250b within one chip (e.g., lower chip 250_b). The via holes 215f may also be used so that separate chip select signals may be routed through one chip (e.g., lower chip 250_b) to another chip (e.g., upper chip 250_t). Moreover, the via holes 215d may be used so that rerouting conductors 221 may be shared by a pair of adjacent devices 250a and 250b.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit chip, comprising:
a semiconductor substrate;
a first integrated circuit device extending adjacent a first side of said semiconductor substrate and having a first plurality of chip pads thereon;
a second integrated circuit device extending adjacent a second side of said semiconductor substrate and having a second plurality of chip pads thereon;
first and second pluralities of via holes extending through a portion of said semiconductor substrate located between the first and second integrated circuit devices;
a first plurality of rerouting conductors extending from corresponding ones of the first plurality of chip pads to corresponding ones of the first plurality of via holes; and
a second plurality of rerouting conductors extending from corresponding ones of the second plurality of chip pads to corresponding ones of the second plurality of via holes;
wherein the integrated circuit chip is configured so that all electrical connections to said first and second integrated circuit devices are provided through the first and second pluralities of via holes; and
wherein all of the first and second pluralities of via holes are provided between the first and second integrated circuit devices.

2. The integrated circuit chip of claim 1, wherein a first one of the first plurality of chip pads is a chip select pad and a first one of the second plurality of chip pads is a chip select pad; and wherein one of the first plurality of rerouting conductors is electrically connected to the first one of the first plurality of chip pads and the first one of the second plurality of chip pads.

3. The integrated circuit chip of claim 1, wherein a first one of the first plurality of chip pads is a chip select pad and a first one of the second plurality of chip pads is a chip select pad; and wherein one of the first plurality of rerouting conductors is electrically connected to the first one of the first plurality of chip pads and one of the second plurality of rerouting conductors is electrically connected to the first one of the second plurality of chip pads.

4. The integrated circuit chip of claim 1, further comprising a rerouting conductor electrically connecting one of the first plurality of chip pads to one of the second plurality of chip pads.

5. A packaged integrated circuit device, comprising:
a package substrate; and
a semiconductor chip mounted to said package substrate, said semiconductor chip comprising a semiconductor substrate having first and second integrated circuit devices at spaced locations therein and a plurality of filled via holes extending through the semiconductor substrate at respective locations extending between the first and second integrated circuit devices;
wherein said semiconductor chip is configured so that all electrical connections to said first and second integrated circuit devices are provided through the plurality of filled via holes; and wherein all of the plurality of filled via holes are provided between the first and second integrated circuit devices.

6. The device of claim 5, wherein the plurality of filled via holes do not extend between any of the first and second integrated circuit devices and an edge of said semiconductor chip.

7. The device of claim 5, further comprising a first plurality of chip pads extending on a surface of said semiconductor chip and located in a space between the first integrated circuit device and the plurality of filled via holes.

8. The device of claim 7, further comprising a second plurality of chip pads extending on a surface of said semiconductor chip and located in a space between the second integrated circuit device and the plurality of filled via holes.

9. The device of claim 8, wherein one of first plurality of chip pads is a first chip select pad; wherein one of the second plurality of chip pads is a second chip select pad; wherein one of the plurality of filled via holes is associated with a first rerouting conductor connected to the first chip select pad; and wherein another one of the plurality of filled via holes is associated with a second rerouting conductor connected to the second chip select pad.

* * * * *